(12) United States Patent
Min et al.

(10) Patent No.: US 9,279,858 B2
(45) Date of Patent: Mar. 8, 2016

(54) CUBICLE TYPE GAS INSULATED SWITCHGEAR MONITORING AND DIAGNOSIS SYSTEM

(71) Applicant: Hyundai Heavy Industries CO., LTD., Ulsan (KR)

(72) Inventors: Byoung Woon Min, Yongin-si (KR); Chang Sun Park, Ulsan (KR); Hyung Ryun Park, Ulsan (KR); Yong Geun Kim, Ulsan (KR)

(73) Assignee: HYUNDAI HEAVY INDUSTRIES CO., LTD., Ulsan (KR)

( * ) Notice: Subject to any disclaimer, the term of this patent is extended or adjusted under 35 U.S.C. 154(b) by 366 days.

(21) Appl. No.: 13/938,439

(22) Filed: Jul. 10, 2013

(65) Prior Publication Data

US 2014/0028324 A1    Jan. 30, 2014

(30) Foreign Application Priority Data

Jul. 10, 2012    (KR) .................. 10-2012-0075277

(51) Int. Cl.
  *G01R 31/327*    (2006.01)
  *H02B 13/065*    (2006.01)

(52) U.S. Cl.
  CPC ........... *G01R 31/327* (2013.01); *H02B 13/065* (2013.01); *H02B 13/0655* (2013.01)

(58) Field of Classification Search
  CPC .................................................. G01R 31/327
  USPC ......................................... 324/537; 361/612
  See application file for complete search history.

(56) References Cited

U.S. PATENT DOCUMENTS

| 7,193,172 | B2* | 3/2007 | Rokunohe | H01H 33/22 218/43 |
| 2003/0128501 | A1* | 7/2003 | Itou | H02B 5/06 361/605 |
| 2003/0144803 | A1* | 7/2003 | Wakida | H02J 13/001 702/62 |
| 2009/0296320 | A1* | 12/2009 | Fink | H02B 13/035 361/612 |

FOREIGN PATENT DOCUMENTS

KR    2011075222 A  *  7/2011  ........... G01R 31/327

OTHER PUBLICATIONS

Genesis Master-Slave Operation GEN DAQ Products Feb. 2009.*

* cited by examiner

*Primary Examiner* — Arleen M Vazquez
*Assistant Examiner* — Brent J Andrews
(74) *Attorney, Agent, or Firm* — Paratus Law Group, PLLC

(57) ABSTRACT

The disclosure relates to a cubicle type gas insulated switchgear monitoring and diagnosis system that is able to remotely monitor and diagnose the state by measuring and analyzing in real time deterioration of a gas section and the operation state and the integrity assessment of a breaking unit in a cubicle gas insulated switchgear. The system includes the cubicle gas insulated switchgear, a Slave Data Acquisition System connected to the cubicle gas insulated switchgear, and a Master Data Acquisition System that determines deterioration of the cubicle type gas insulated switchgear and the operation state and the integrity assessment of the breaking unit by receiving and analyzing the sensing data from the S-DAS.

8 Claims, 3 Drawing Sheets

CUBICLE TYPE GAS INSULATED SWITCHGEAR MONITORING AND DIAGNOSIS SYSTEM

CROSS-REFERENCE TO RELATED APPLICATION

This application claims priority under 35 U.S.C. §119 to Korean Application No. 10-2012-0075277 filed on Jul. 10, 2012, which is hereby incorporated by reference in its entirety.

BACKGROUND

The disclosure relates to a gas insulated switchgear monitoring and diagnosis system, particularly to a cubicle type gas insulated switchgear monitoring and diagnosis system that can remotely monitor and diagnose the state by measuring and analyzing in real time deterioration of a gas section and the operation state and the integrity assessment of a breaking unit in a cubicle gas insulated switchgear.

Gas insulated substations are stations equipped with an $SF_6$ gas breaker to open/closing the electric circuit in the stations, breakers opening/closing electric circuits such as power transmission lines and power distribution lines are disposed in the substations, and there are an oil circuit breaker, a magnetic blast circuit breaker, a vacuum circuit breaker, and an $SF_6$ gas breaker, in accordance with the types of insulators used in the breakers.

The $SF_6$ gas breaker, a breaker filled with an $SF_6$ gas having excellent dielectric strength, can be sufficiently installed even in an area of 5 to 10% of an outdoor structure substation, such that the size of the substation decreases and the installation area can be considerably decreased. Further, the nontoxic and incombustible $SF_6$ gas is used and the charging part is sealed, unlike the outdoor structure substation, such that the substation is little influenced by climate and the insulators are prevented from being contaminated and damaged by dust, steam, and sea wind, and thus the safety is high.

The $SF_6$ gas breaker has the advantage that it has large breaking capacity and is easily handled and it is not necessary to lubricating a hydraulic breaker. Further, the breaking unit is positioned lower, such that it is easy to check the inside. Furthermore, since it has a closed structure with high-voltage equipment, such as a disconnecting switch, an arrester, and an instrument transformer, in a metal container, the operation noise is small; therefore, it is suitable for the environment even if it is installed at any one of countries and cities, and is generally used for high-voltage substations with 66 kV or more.

The $SF_6$ gas breaker, also called a GIS (Gas Insulated Switchgear), is used as an electric power substation equipment composite apparatus that not only opens/closes a current in a normal state, but safely opens/closes an operation even in an abnormal state such as a short circuit, using the excellent physical and electrical properties of the $SF_6$, thereby protecting the system.

A CGIS (Cubicle type Gas Insulated Switchgear), a system that removes the deficit of breaking capacity and the limit in size due to the insulating performance, which are the defects of the VCB (Vacuum Circuit Breaker) or an ACB (Air Circuit Breaker) that have been used in the related art, is an indoor breaker developed in a cubicle type by insulating $SF_6$.

The cubicle type gas insulated switchgear, important equipment that controls a power distribution system, rapidly cuts a fault current in failure. However, when the cubicle type gas insulated switchgear fails to accurately operate due to deterioration of it and an error in the breaking unit, a large accident such as a breakdown of the entire power distribution system may be caused.

In the related art, a device that monitors and diagnoses a gas insulated switchgear was used to reduce the maintenance cost and prevent a failure in the gas insulated switchgear. However, not only the device is expensive for the cubicle type gas insulated switchgear, but it is difficult to analyze the characteristics of the breaking unit because it is designed for a gas insulated switchgear.

Therefore, a person regularly examines a cubicle type gas insulated switchgear controlling power distribution in person with naked eyes and a portable measuring instrument in the existing way, rather than using a monitoring and diagnosing system, a person evaluates the integrity assessment of the breaker by examining in person the state of a coil, the state of stroke, and the operation time due to a non-load operation. A technology of a system for examination, maintenance, monitoring, and diagnosing is intensively necessary to solve the problems.

SUMMARY

An object of the present disclosure is to provide a cubicle type gas insulated switchgear monitoring and diagnosis system that can remotely monitor and diagnose the state by measuring and analyzing in real time deterioration of a gas section and the operation state and the integrity assessment of a breaking unit in a cubicle gas insulated switchgear.

In the embodiments, a cubicle type gas insulted switchgear monitoring and diagnosis system includes: a cubicle type gas insulated switchgear that (i) measures deterioration of a gas section using a plurality of gas pressure sensor disposed in a breaking unit and a bushing bar unit, respectively, which are closed, and measuring a gas pressure, and a partial discharge sensor disposed at one end of a gas duct and measuring partial discharge, (ii) evaluate the operation state and the integrity assessment of a breaker, using a coil pressure sensor disposed at the breaking unit and measuring the integrity assessment of a driving coil and a stroke sensor disposed at a driving unit of the breaker and measuring the position of a stroke bar; an S-DAS (Slave Data Acquisition System) that makes one-to-one correspondence with the cubicle type gas insulated switchgear, is electrically connected with the gas pressure sensor, the coil pressure sensor, the partial discharge sensor, and the stroke sensor, and provides sensing data as digital data; and an M-DAS (Master Data Acquisition System) that determines deterioration of the cubicle type gas insulated switchgear and the operation state and the integrity assessment of the breaking unit by receiving and analyzing the sensing data from the S-DAS.

In an embodiment, the M-DAS and the S-DAS may make 1-to-n correspondence.

In an embodiment, the M-DAS may construct a history database by collecting the provided sensing data.

In an embodiment, the S-DAS may include a display unit that displays in real time the provided sensing data at a worksite.

Therefore, according to the present disclosure, it is possible to remotely monitor and diagnose the state by measuring and analyzing in real time deterioration of a gas section and the operation state and the integrity assessment of a breaking unit in a cubicle gas insulated switchgear.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
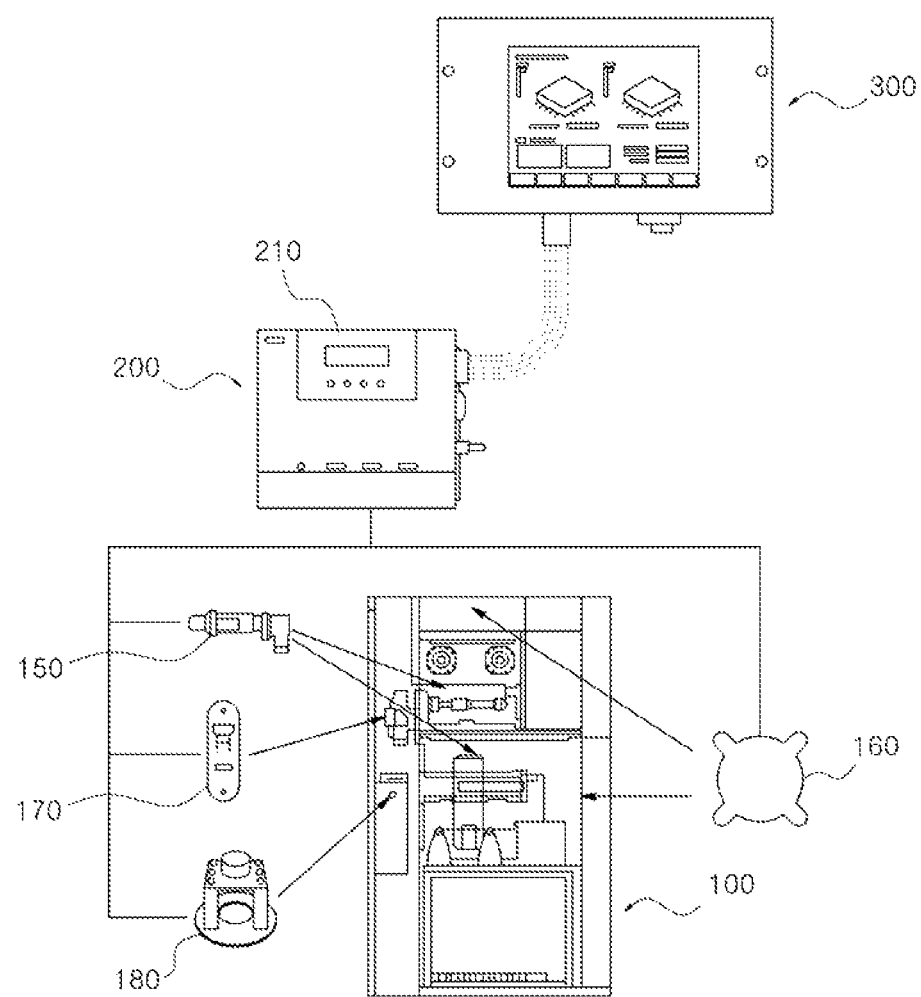
FIG. 1 is a diagram illustrating a cubicle type gas insulated switchgear monitoring and diagnosis system according to an embodiment of the present disclosure.

The description of the disclosed technology is just examples for structural and functional illustration, and thus the scope of the disclosure should not be interpreted as being limited by these examples. That is, since the present invention may be variously modified and have several exemplary embodiments, the scope of the disclosure should be understood as including equivalents by which the spirit of the disclosure can be achieved.

The terms used herein should be understood as follows.

Terms, such as "first", "second" etc, are only used to differentiate one component from other components, but the scope is not limited to the terms. For example, the first component may be named the second component and the second component may also be similarly named the first component.

The term "and/or" should be understood as including all of combination that can be made from one or more relevant items. For example, the term "the first item, the second item, and/or the third item" means not only the first, the second, or the third item, but the combination of all of items that can be made from two or more of the first, second, or third items.

It is to be understood that when one element is referred to as being "connected to" another element, it may be connected directly to another element or be connected to another element, having the other element intervening therebetween. On the other hand, it is to be understood that when one element is referred to as being "connected directly to" another element, it may be connected to another element without the other element intervening therebetween. Further, other expressions describing the relationships of components, that is, "between" and "directly between", or "close to" and "directly close to" should be understood in the same way.

Singular forms are intended to include plural forms unless the context clearly indicates otherwise. It will be further understood that the terms "comprises" or "have" as used in this specification specify the presence of stated features, steps, operations, components, parts, or a combination thereof, but do not preclude the presence or addition of one or more other features, numerals, steps, operations, components, parts, or a combination thereof.

The reference characters (for example, a, b, and c) used in the steps are used for the convenience of illustrating, and they do not mean the order of the steps and the steps may be generated in different orders, unless the order is specifically stated. That is, the steps may be generated in the order described and substantially simultaneously, but they may be performed in reverse direction.

Unless indicated otherwise, it is to be understood that all the terms used in the specification including technical and scientific terms have the same meaning as those as understood by those who are skilled in the art. It should be understood that the terms defined by a dictionary must be identical with the meanings within the context of the related art, and they should not be ideally or excessively formally defined unless the context clearly dictates otherwise.

FIG. 1 is a diagram illustrating an example of a cubicle type gas insulated switchgear monitoring and diagnosis system according to an embodiment of the present disclosure.

Referring to FIG. 1, a cubicle type gas insulated switchgear monitoring and diagnosis system includes a cubicle type gas insulated switchgear 100, an S-DAS (Slave Data Acquisition System) 200, and an M-DAS (Master Data Acquisition System). The cubicle type gas insulated switchgear 100 includes a plurality of gas pressure sensors 150, a partial discharge sensor 160, a coil pressure sensor 170, and a stroke sensor 180.

Figure 2:
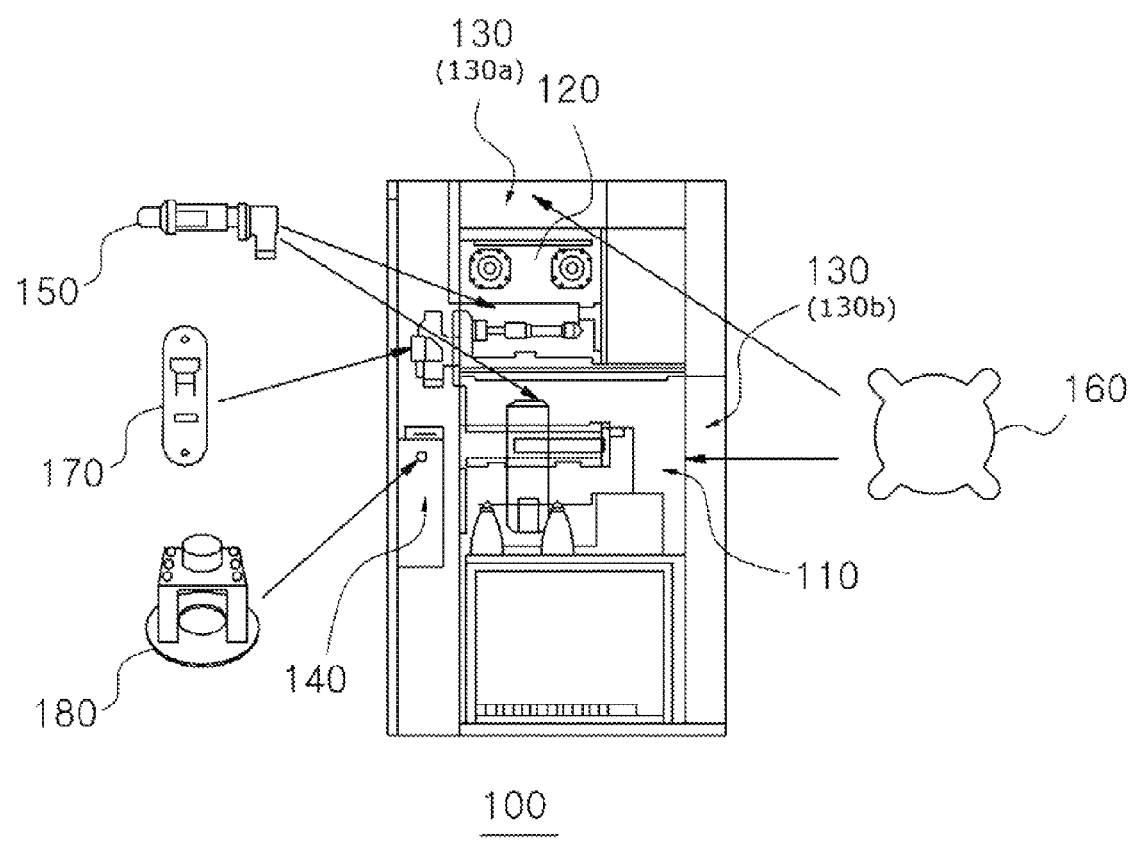
FIG. 2 is a diagram illustrating a cubicle type gas insulated switchgear of the cubicle type gas insulated switchgear monitoring and diagnosis system of FIG. 1.

FIG. 2 is a diagram illustrating a cubicle type gas insulated switchgear of the cubicle type gas insulated switchgear monitoring and diagnosis system.

Referring to FIG. 2, the cubicle type gas insulated switchgear 100 includes a breaking unit 110, a bushing bar unit 120, a gas duct 130, a breaker driving unit 140, the plurality of gas pressure sensors 150, the partial discharge sensor 160, the coil pressure sensor 170, and the stroke sensor 180.

The breaking unit 110 is a receiving space in which a circuit breaker is substantially enclosed. The breaking unit 110 is filled with an insulation gas. The breaker driving unit 140 that can drive the breaking unit 110 is attached to the breaking unit 110.

The bushing bar unit 120 is a receiving space that is disposed above the breaking unit 110 and substantially encloses a bushing bar therein. The bushing bar unit 120 is filled with an insulation gas. The bushing bar is electrically connected with the breaker and the external devices.

The gas duct 130 provides a passage through which a hot gas, which is generated by arc generated in a tank by the operation of the devices, is discharged outside. In an embodiment, the gas duct 130 may include a first gas duct 130a disposed on the bushing bar unit 110 and a second gas duct 130b disposed on the rear side of the breaking unit 110.

The gas pressure sensors 150 are disposed in the breaking unit 110 and the bushing bar unit 120 and measure the pressure of the insulation gas therein. That is, the gas pressure sensors 150 measure whether the gas in the breaking unit 110 and the bushing bar unit 120 leaks to the outside.

The partial discharge sensor 160 disposed at one end of the gas duct 130 and measures partial discharge. In an embodiment, when the gas duct 130 includes a first gas duct 130a and a second gas duct 130b, the partial discharge sensor 160 may include a first partial discharge sensor and a second partial discharge sensor and may be disposed in the first gas duct and the second gas duct, respectively.

The coil pressure sensor 170 is disposed at the breaking unit 110 and measures integrity assessment of a driving coil.

The stroke sensor 180 is disposed at the driving unit 140 of the breaker and measures the position of a stroke bar. In an embodiment, the stroke sensor 180 may be attached to a valve of the driving unit 140 of the breaker and may detect and correct the amount of movement of the valve.

The following table shows the specification and the use of the sensors.

TABLE 1

| Item | specification & use |
|---|---|
| Gas pressure sensor | Value and alarm information about gas pressure change generated<br>Temperature compensation function included<br>Measurement range: 1 bar~1.3 bar |
| Partial discharge sensor | Sensor: UHF sensor<br>Measurement range: 0.3 GHz~3.0 GHz<br>Partial discharge detection range: 0.5 GHz~1.5 GHz<br>Rupture disc-mounted type |
| Coil pressure sensor | Power: 12 V<br>Rate current: 5 A<br>Measured object: Trip Coil, Close Coil<br>Coil Current: Integrity assessment of driving coil measured<br>Used in measuring operation time of driving unit |
| Stroke sensor | Power: 12 V<br>Position of stroke bar measured: Integrity assessment evaluated from path of driving unit<br>Rotate Resister type (Lifespan increased)<br>Used in determining operation sequence of driving unit |

Referring to FIG. 1 again, the S-DAS (Slave Data Acquisition System) is electrically connected with the gas pressure sensors 150, the coil pressure sensor 170, the partial discharge sensor 160, and the stroke sensor 180 and provides sensing data as digital data. The S-DAS 200 corresponds to the cubicle type gas insulated switchgear one to one. In an embodiment, the S-DAS 200 may include a display unit 210 that displays the sensing data provided from the worksite in real time. In an embodiment, the S-DAS 200 can monitor in real time the sensing data from the gas pressure sensors 150 and the partial discharge sensor 160 and can analyze and record the sensing data from the coil pressure sensor 170 and the stroke sensor 180.

The M-DAS (Master Data Acquisition System) 300 determines deterioration and integrity assessment of the cubicle type gas insulated switchgear 100 by receiving and analyzing the sensing data from the S-DAS 200. The M-DAS 300 analyzes deterioration on the basis of the sensing data from the gas pressure sensors 150 and the partial discharge sensor 160 and evaluates the operation status and the integrity assessment of the breaking unit 110 by analyzing the sensing data from the coil pressure sensor 170 and the stroke sensor 180 in the breaking operation or the closing operation of the cubicle type gas insulated switchgear. In an embodiment the M-DAS 300 and the S-DAS 200 may receive sensing data through an optical Ethernet. In an embodiment, the M-DAS 300 may construct a history database by collecting the sensing data from the S-DAS 200. In an embodiment, the M-DAS 300 may include a display unit 210 that displays in real time the sensing data from the S-DAS 200, and the operation status, the integrity assessment, and deterioration of the breaking unit 110.

Figure 3:
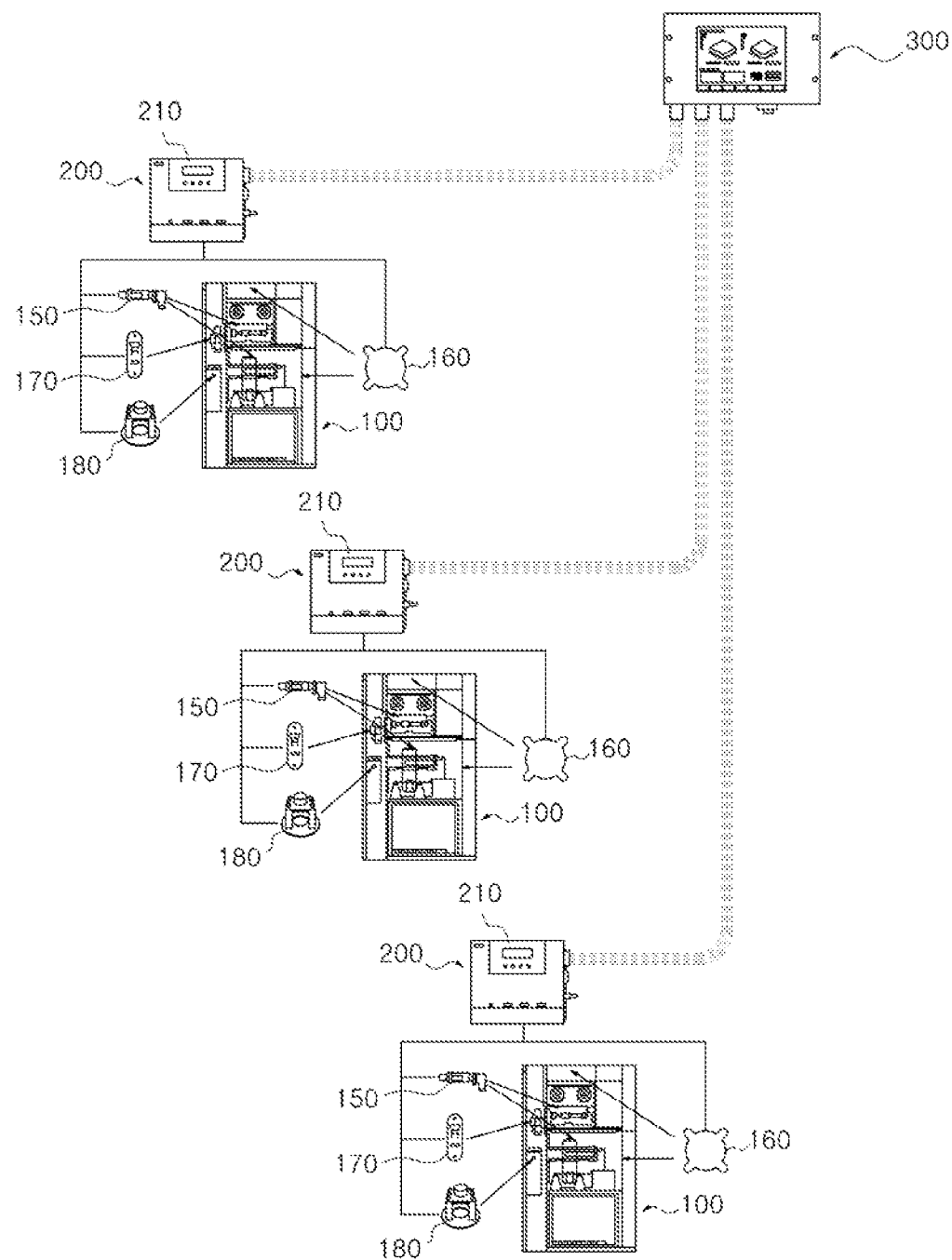
FIG. 3 is a diagram illustrating one-to-n correspondence of an M-DAS (Master Data Acquisition System) and an S-DAS (Slave Data Acquisition System) according to an embodiment of the cubicle type gas insulated switchgear monitoring and diagnosis system of FIG. 1.

FIG. 3 is a diagram illustrating one-to-n correspondence of an M-DAS and an S-DAS according to an embodiment of the cubicle type gas insulated switchgear monitoring and diagnosis system of FIG. 1.

Referring to FIG. 3, the M-DAS 300 and the S-DAS 200 can make 1-to-n correspondence. That is, the M-DAS 300 can be connected with a plurality of S-DASs 200 and determine deterioration of the cubicle type gas insulated switchgear 100 and the integrity assessment of the breaking unit 110 by receiving and analyzing the provided sensing data.

Therefore, according to the present disclosure, it is possible to remotely monitor and diagnose the state by measuring and analyzing in real time deterioration of a gas section and the integrity assessment of a driving unit in a cubicle gas insulated switchgear.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A cubicle type gas insulated switchgear monitoring and diagnosis system comprising:
   a breaking unit having a space in which a circuit breaker is enclosed and an insulation gas is filled;
   a driving unit, attached to the breaking unit, configured to drive the breaking unit;
   a bushing bar unit, electrically connected with the circuit breaker, in which the insulation gas is filled;
   a gas duct comprising a passage through which a hot gas is discharged, the hot gas being generated by arc;
   a plurality of gas pressure sensors, disposed in the breaking unit and the bushing bar unit, configured to measure a gas pressure;
   a partial discharge sensor, disposed at one end of the gas duct, configured to measure a partial electric discharge;
   a coil pressure sensor, disposed at the breaking unit, configured to evaluate an operation state and to assess an integrity of the breaking unit and to measure and to assess an integrity of a driving coil;
   a stroke sensor, disposed at a driving unit of the breaking unit, configured to measure a position of a stroke bar;
   an S-DAS (Slave Data Acquisition System), one-to-one correspondence with the cubicle type gas insulated switchgear, and electrically connected with the gas pressure sensors, the coil pressure sensor, the partial discharge sensor, and the stroke sensor, the S-DAS configured to
   provide sensing data as digital data, the sensing data transmitted from the plurality of gas pressure sensors and the partial discharge sensor and
   to analyze and record the sensing data from the coil pressure sensor and the stroke sensor; and
   an M-DAS (Master Data Acquisition System) configured to determine deterioration of the cubicle type gas insulated switchgear and to evaluate the operation state and to assess an integrity of the breaking unit, by receiving and analyzing the sensing data from the S-DAS,
   the M-DAS further configured to analyze deterioration based on the sensing data transmitted from the plurality of gas pressure sensors and the partial discharge sensor and to evaluate an operation status and the integrity assessment of the breaking unit by analyzing the sensing data from the coil pressure sensor and the stroke sensor, wherein a display unit is configured to display in real time the sensing data from the S-DAS, and the operation status, the integrity assessment, and deterioration of the breaking unit.

2. The system according to claim 1, further comprising:
one or more cubicle type gas insulated switchgears and one or more S-DASs each corresponding to each of the cubicle type gas insulated switchgears, wherein the M-DAS makes 1-to-n correspondence with the S-DAS.

3. The system according to claim 1, wherein the M-DAS comprises a history database which configured to collect the sensing data.

4. The system of claim 1, wherein the bushing bar unit is positioned on and above the breaking unit and encloses a bushing bar therein, wherein the bushing bar is electrically connected with the circuit breaker and an external device.

5. The system of claim 1, wherein the gas duct includes:
a first gas duct disposed on a top portion of the bushing bar unit; and
a second gas duct disposed on a rear side of the breaking unit.

6. The system of claim 5, wherein the partial discharge sensor includes:
a first partial discharge sensor disposed in the first gas duct; and
a second partial discharge sensor disposed in the second gas duct.

7. The system of claim 1, wherein the gas pressure sensors are configured to measure if the insulation gases in the breaking unit and the bushing bar units leak.

8. A cubicle type gas insulated switchgear monitoring and diagnosis system comprising:
a plurality of cubicle type gas insulated switchgears including:
a breaking unit in which a circuit breaker is provided and an insulation gas is filled,
a driving unit which is attached to the breaking unit configured to drive the breaking unit,
a bushing bar unit in which the insulation gas is filled,
a gas duct which provides a passage through which a hot gas is discharged,
a plurality of gas pressure sensors, disposed in the breaking unit and the bushing bar unit, configured to measure a gas pressure,
a partial discharge sensor, disposed at one end of the gas duct, configured to measure a partial electric discharge,
a coil pressure sensor, disposed at the breaking unit, configured to measure an integrity assessment of a driving coil, and
a stroke sensor, disposed at the driving unit of the breaking unit, configured to measure a position of a stroke bar;
a plurality of S-DASs (Slave Data Acquisition Systems) each corresponding to one of the cubicle type gas insulated switchgears and electrically connected with the gas pressure sensor, the coil pressure sensor, the partial discharge sensor, and the stroke sensor, the S-DASs configured to provide sensing data as digital data, the sensing data transmitted from the plurality of gas pressure sensors and the partial discharge sensor and
to analyze and record the sensing data from the coil pressure sensor and the stroke sensor; and
an M-DAS (Master Data Acquisition System) connected to each of the plurality of the S-DASs configured to determine deterioration of each of the cubicle type gas insulated switchgears and to evaluate the operation state and to assess an integrity of the breaking unit of the cubicle type gas insulated switchgears, by receiving and analyzing the sensing data from each of the plurality of the S-DASs,
the M-DAS further configured to analyze deterioration based on the sensing data transmitted from the plurality of gas pressure sensors and the partial discharge sensor and
to evaluate an operation status and the integrity assessment of the breaking unit by analyzing the sensing data from the coil pressure sensor and the stroke sensor,
wherein a display unit is configured to display in real time the sensing data from each of the plurality of the S-DASs, and the operation status, the integrity assessment, and deterioration of the breaking unit.

\* \* \* \* \*